(12) United States Patent
MacGillivray et al.

(10) Patent No.: US 8,774,238 B2
(45) Date of Patent: Jul. 8, 2014

(54) MODE-LOCKED OPTICALLY PUMPED SEMICONDUCTOR LASER

(75) Inventors: Ian MacGillivray, Glasgow (GB); Andrea Caprara, Palo Alto, CA (US); Sergei Govorkov, Los Altos, CA (US)

(73) Assignee: Coherent, Inc., Santa Clara, CA (US)

( * ) Notice: Subject to any disclaimer, the term of this patent is extended or adjusted under 35 U.S.C. 154(b) by 220 days.

(21) Appl. No.: 13/174,330

(22) Filed: Jun. 30, 2011

(65) Prior Publication Data

US 2013/0003761 A1 Jan. 3, 2013

(51) Int. Cl.
*H01S 3/081* (2006.01)
*H01S 5/065* (2006.01)

(52) U.S. Cl.
USPC .............................................. 372/18; 372/93

(58) Field of Classification Search
USPC ...................................... 372/18, 93
See application file for complete search history.

(56) References Cited

U.S. PATENT DOCUMENTS

| | | | |
|---|---|---|---|
| 5,097,471 A | 3/1992 | Negus et al. | |
| 6,081,379 A | 6/2000 | Austin et al. | |
| 6,097,742 A | 8/2000 | Caprara et al. | |
| 6,154,318 A | 11/2000 | Austin et al. | |
| 6,243,407 B1 | 6/2001 | Mooradian | |
| 6,834,064 B1 | 12/2004 | Paschotta et al. | |
| 7,035,012 B2 * | 4/2006 | Govorkov et al. | 359/618 |
| 7,894,493 B2 | 2/2011 | Resan et al. | |
| 2009/0290606 A1 | 11/2009 | Chilla et al. | |
| 2011/0150013 A1* | 6/2011 | Spinelli et al. | 372/18 |
| 2012/0250719 A1* | 10/2012 | Hodgson et al. | 372/70 |

FOREIGN PATENT DOCUMENTS

| | | |
|---|---|---|
| EP | 2031712 A2 | 3/2009 |
| EP | 2031712 A3 | 8/2011 |
| WO | 01/43242 A1 | 6/2006 |

OTHER PUBLICATIONS

International Search Report and Written Opinion received for PCT Patent Application No. PCT/US2012/043846, mailed on Oct. 30, 2012, 18 pages.
Saarinen et al., "Power-Scalable 1.57 µm Mode-Locked Semiconductor Disk Laser using Wafer Fusion", Optics Letters, vol. 34, No. 20, Oct. 15, 2009, pp. 3139-3141.
Sieber et al., "Scaling high-power ultrafast VECSELs into the femtosecond regime", Proceedings of SPIE vol. 7919, 2011, pp. 79190P-1-79190P-4.
Tropper, A. C., "Femtosecond surface-emitting lasers", Proceedings of SPIE, vol. 7919, 2011, pp. 79190Y-1-79190Y-7.
Klopp et al., "Mode-locked InGaAs—AlGaAs disk laser generating sub-200-fs pulses, pulse picking and amplification by a tapered diode amplifier", Optics Express, vol. 17, No. 13, Jun. 22, 2009, pp. 10820-10834.
Hodgson et al., U.S. Appl. No. 13/079,737, filed Apr. 4, 2011, titled as "Transition-Metal-Doped Thin-Disk Laser".

(Continued)

*Primary Examiner* — Tod T Van Roy
*Assistant Examiner* — Marcia Golub-Miller
(74) *Attorney, Agent, or Firm* — Morrison & Foerster LLP

(57) ABSTRACT

A laser includes an optically pumped semiconductor OPS gain-structure. The apparatus has a laser-resonator which includes a mode-locking device for causing the laser to deliver mode-locked pulses. The resonator has a total length selected such that the mode-locked pulses are delivered at a pulse repetition frequency of about 100 MHz. An optical arrangement within the resonator provides that radiation circulating in the resonator makes a plurality of incidences on the OPS gain-structure with a time less than the excited-state lifetime of the gain-structure between successive incidences.

16 Claims, 5 Drawing Sheets

(56) References Cited

OTHER PUBLICATIONS

Hertwig et al., U.S. Appl. No. 12/759,465, filed Apr. 13, 2010, titled as "Polarization Maintaining Multi-Pass Imaging System for Thin-Disk Amplifiers and Oscillators".

Chilla et al., "Recent Advances in Optically Pumped Semiconductor Lasers", Solid State Lasers XVI: Technology and Devices, edited by Hoffman et al., Proc. of SPIE, vol. 6451, 2007, pp. 645109-1-645109-10.

* cited by examiner

MODE-LOCKED OPTICALLY PUMPED SEMICONDUCTOR LASER

TECHNICAL FIELD OF THE INVENTION

The present invention relates in general to external cavity, surface-emitting optically pumped semiconductor (OPS) lasers. The invention relates in particular to mode-locked OPS-lasers.

DISCUSSION OF BACKGROUND ART

Mode-locked lasers including a solid-state gain-medium provide very short pulses at relatively high pulse-repetition rates. Typical mode-locked lasers operate at a pulse repetition frequency of between about 50 and 150 MHz megahertz (MHz) with 80 MHz being typical. Depending on the gain-medium, pulses can have a FWHM duration of about 100 picoseconds or less. Most commercially available mode-locked lasers employ a solid-state gain-medium with a relatively broad gain-bandwidth. The most common solid-state gain-medium is titanium-doped aluminum oxide (Ti:Sapphire or $Ti:Al_2O_3$) which can provide gain with a limited range of tunability in a fundamental wavelength range between about 700 nanometers and 900 nanometers. The wavelength range of such lasers can be extended by frequency conversion of the output radiation having the fundamental wavelength.

A common application of mode-locked laser pulses is for fluorophore excitation in multi-photon microscopy. This application would benefit from the availability of mode-locked pulses the wavelength of which could be tailored for specific fluorophores.

OPS-lasers include a multilayer semiconductor surface-emitting gain-structure having active or quantum-well (Q-W) layers spaced apart by spacer layers. The output wavelength of such lasers can be "tailored" to a particular value by selecting an appropriate composition of the semiconductor material of the active layers. This can provide, in theory at least, fundamental wavelengths from the ultraviolet spectral region to the mid-infrared region of the electromagnetic spectrum. A characteristic of semiconductor gain-media is that the excited-state lifetime of such gain-media is relatively very short, for example, about 10 nanoseconds (ns) or less, compared with one millisecond or more for a solid-state gain-medium. It is for this reason that mode-locking in semiconductor lasers has only been achieved with very short resonators, at correspondingly very high pulse repetition frequency (PRF), for example, a few gigahertz (GHz). This provides that multiple round trips in the resonator can be achieved within the excited-state lifetime of the semiconductor gain-medium. Unfortunately, the pulse energy achievable at such a high PRF is too low and the PRF is too high for multi-photon microscopy applications. There is a need to overcome this deficiency of OPS-lasers to enable the wavelength-selection advantage thereof to be made available for optimizing the response of particular fluorophores in multi-photon microscopy applications.

SUMMARY OF THE INVENTION

In one aspect, apparatus in accordance with the present invention comprises a laser-resonator having a resonator length. At least one surface-emitting multilayer semiconductor gain-structure located in the laser-resonator. The at least one and any other gain-structure includes a plurality of active-layers spaced apart by spacer-layers and have an excited-state lifetime characteristic of material of the active-layers. Means are provided for energizing the gain-structure, thereby causing radiation having a fundamental wavelength characteristic of the active layers of the gain-structure to circulate in the laser-resonator. Mode-locking means are located in the laser-resonator for causing the circulating radiation to circulate as sequence of mode-locked pulses at a predetermined pulse-repetition frequency determined by the resonator length. An optical arrangement is provided for causing the circulating radiation to make a predetermined plurality of gain-structure incidences during each round trip thereof in the laser-resonator, with a predetermined time between gain-structure incidences less than twice excited-state lifetime of the gain-structure.

This arrangement provides that the PRF of mode-locked pulses output by the inventive apparatus can be selected to be comparable with that of prior-art solid-state mode-locked lasers while providing that a circulating pulse can make a plurality of incidences on one or more gain-structures with a period less than twice the excited-state lifetime between incidences, thereby allowing resonant build-up of pulse energy. In preferred embodiments of the invention, the resonator length is selected such that the pulse repetition frequency is between about 50 MHz and 150 MHz and there are at least four gain-structure incidences per round trip in the resonator.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
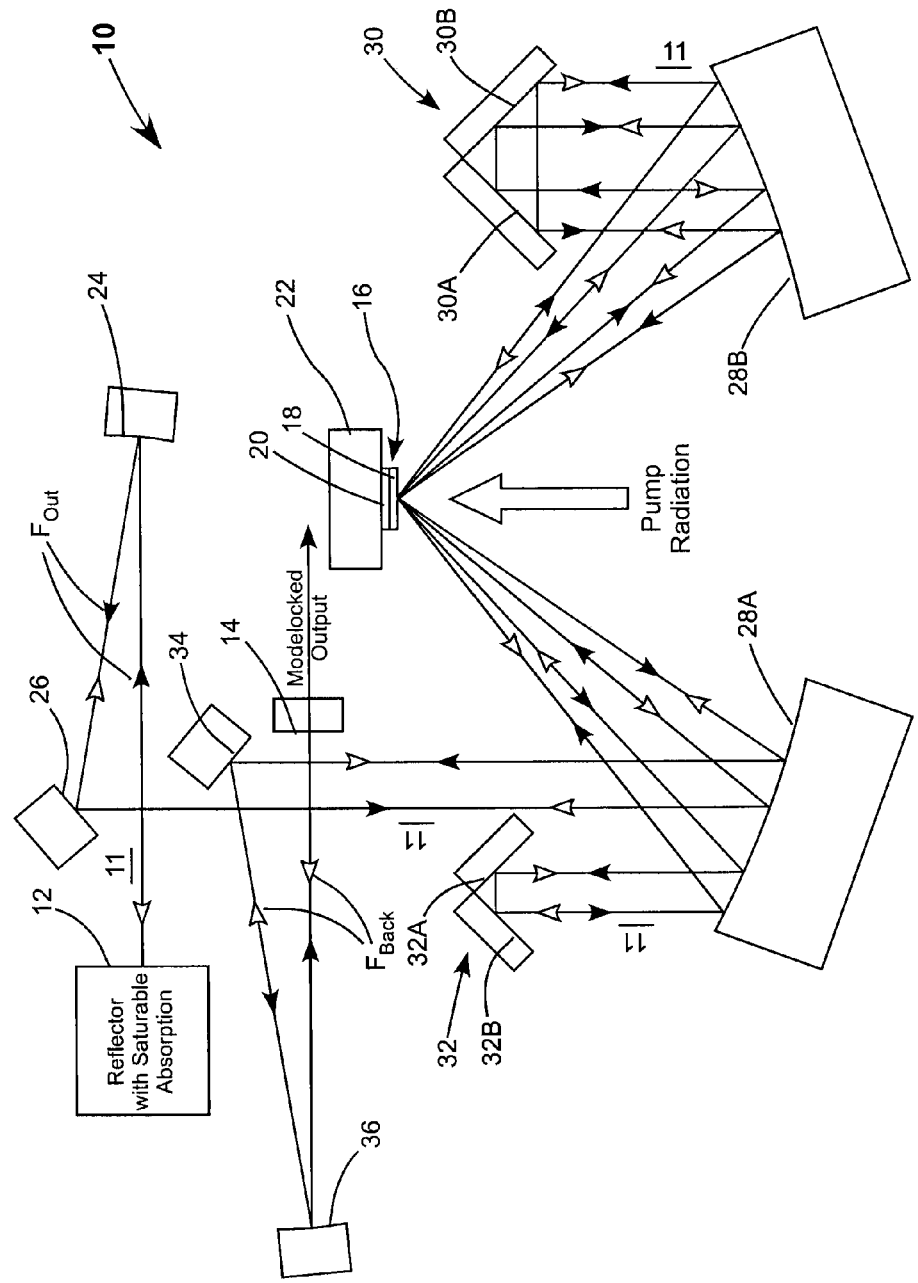
FIG. 1 schematically illustrates one preferred embodiment of a mode-locked OPS-laser in accordance with the present invention, including a resonator having a total length selected to provide an output PRF on the order of 80 MHz, and a gain-module including an optically pumped OPS gain-structure and configured such that radiation circulating in the resonator makes eight incidences on the gain-structure during each round trip in the resonator, with a time between successive incidences less than twice the excited-state lifetime of the OPS gain-structure.

Referring now to the drawings, wherein like components are designated by like reference numerals, FIG. 1 schematically illustrates one preferred embodiment 10 of a mode-locked OPS-laser in accordance with the present invention. Laser 10 includes a standing-wave laser-resonator 11 formed between a partially reflecting and partially transmitting mirror 14, and a mirror 12 including saturable absorption, such as a saturable Bragg reflector (SBR), or a semiconductor saturable absorbing mirror (SESAM). Mirror 12 provides for mode-locking of the laser-resonator. Mirror 14 serves as an output-coupling mirror of the laser-resonator.

Optical gain in the laser-resonator is provided by an OPS-structure (OPS-chip) 16 including a multilayer semiconductor gain-structure 18, surmounting a mirror-structure 20. The gain-structure includes a plurality of active-layers spaced apart by spacer-layers and has an excited-state lifetime characteristic of material of the active-layers. The gain-structure is energized by optical pump radiation, as indicated, to cause laser radiation to circulate in resonator 11 in a manner described in detail further hereinbelow. Pump radiation is preferably provided by a diode-laser or a diode laser array (not shown). The OPS-chip is supported in thermal communication with a heat-sink 22. A detailed description of such an OPS-structure is not necessary for understanding principles of the present invention and, accordingly is not presented herein. Of note is that the excited-state lifetime of such a gain-structure is on the order of about 3 ns, as discussed above. A detailed description of growth, composition, materials, and exemplary gain-wavelengths of OPS-structures is provided in U.S. Pat. No. 6,097,742, assigned to the assignee of the present invention, and the complete disclosure of which is hereby incorporated herein by reference.

Included in the laser-resonator 11 is an arrangement for causing multiple incidences on the gain-structure of radiation circulating in the resonator during each round trip in the resonator of the circulating radiation, with a time between successive incidence preferably less than about twice the excited-state lifetime of OPS gain-structure 18, and more preferably about equal to or less than the excited-state lifetime. Here, the multiple-incidence arrangement includes concave mirrors 28A and 28B, cooperative with retro-reflecting mirror-pairs 30 and 32 and mirror-structure 20 of OPS-structure 16.

Tracing a beam leaving mirror 12 (indicated by solid arrowheads $F_{Out}$): the beam is incident on a concave mirror 24; is reflected from mirror 24 to a plane mirror 26; and is reflected from mirror 26 onto concave mirror 28A. The beam is reflected from mirror 28A to make a first incidence on (forward and reflected pass through) the gain-structure of the OPS-chip. Mirror-structure 20 reflects the first-incidence beam onto mirror 28B from which it is reflected onto mirror 30A of retro-reflector 30. Mirror 30A reflects the beam onto mirror 30B, which reflects the beam back onto mirror 28B.

Mirror 28B reflects the beam back onto OPS-chip 18 to make a second incidence on the OPS gain-structure. The beam is then reflected by mirror-structure 20 onto mirror 28A. Mirror 28A reflects the beam onto mirror 32A of retro-reflector 30. Mirror 32A reflects the beam onto mirror 32B of the reflector, which reflects the beam back onto mirror 28A.

The beam is then reflected from mirror 28A to make a third incidence on the gain-structure of the OPS-chip. Minor-structure 20 reflects the third-incidence beam onto minor 28B from which it is reflected again onto mirror 30B of retro-reflector 30. Mirror 30B reflects the beam onto minor 30A, which reflects the beam back onto mirror 28B.

Mirror 28B reflects the beam back onto OPS-chip 18 to make a fourth incidence on the OPS gain-structure. The beam is then reflected by mirror-structure 20 onto mirror 28A. Mirror 28A, this time, reflects the beam onto a plane mirror 34 of resonator 11. Mirror 34 reflects the beam onto a concave mirror 36. Mirror 36 reflects the beam onto output coupling mirror 14. At this point, the beam has completed one-half of a round-trip in resonator 11 and experienced four incidences on the OPS-chip. Mirror 14 then reflects the beam back along the incident path as indicated by open arrowheads $F_{Back}$. The beam then completes a round trip by re-tracing the above-described original path, thereby making a further four incidences on (passes through) gain-structure 18 before completing the round trip in resonator 11. A particular point to note here, is that OPS-chip 16 is located at about the focus of mirrors 28A and 28B such that the beam has about the same height at each incidence thereof on the OPS-chip.

It should also be noted that a high modulation depth is required for a saturable absorption reflector for providing mode-locking. In apparatus 10, the fold-mirror arrangement including concave mirrors 24 and 36 is configured to concentrate circulating radiation on SESAM 12 to maximize the modulation depth. Alternatively a saturable absorbing mirror could be included in the resonator in a position where radiation would be incident thereon two or more times per round trip. In resonator 11, this could be for example on one of mirrors 30A and 30B. It would even be possible to build a saturable absorption function into mirror-structure 20 of OPS-chip 16. Those skilled in the art may use these mode-locking arrangements, or devise other mode-locking arrangements without departing from the spirit and scope of the present invention.

Figure 2:
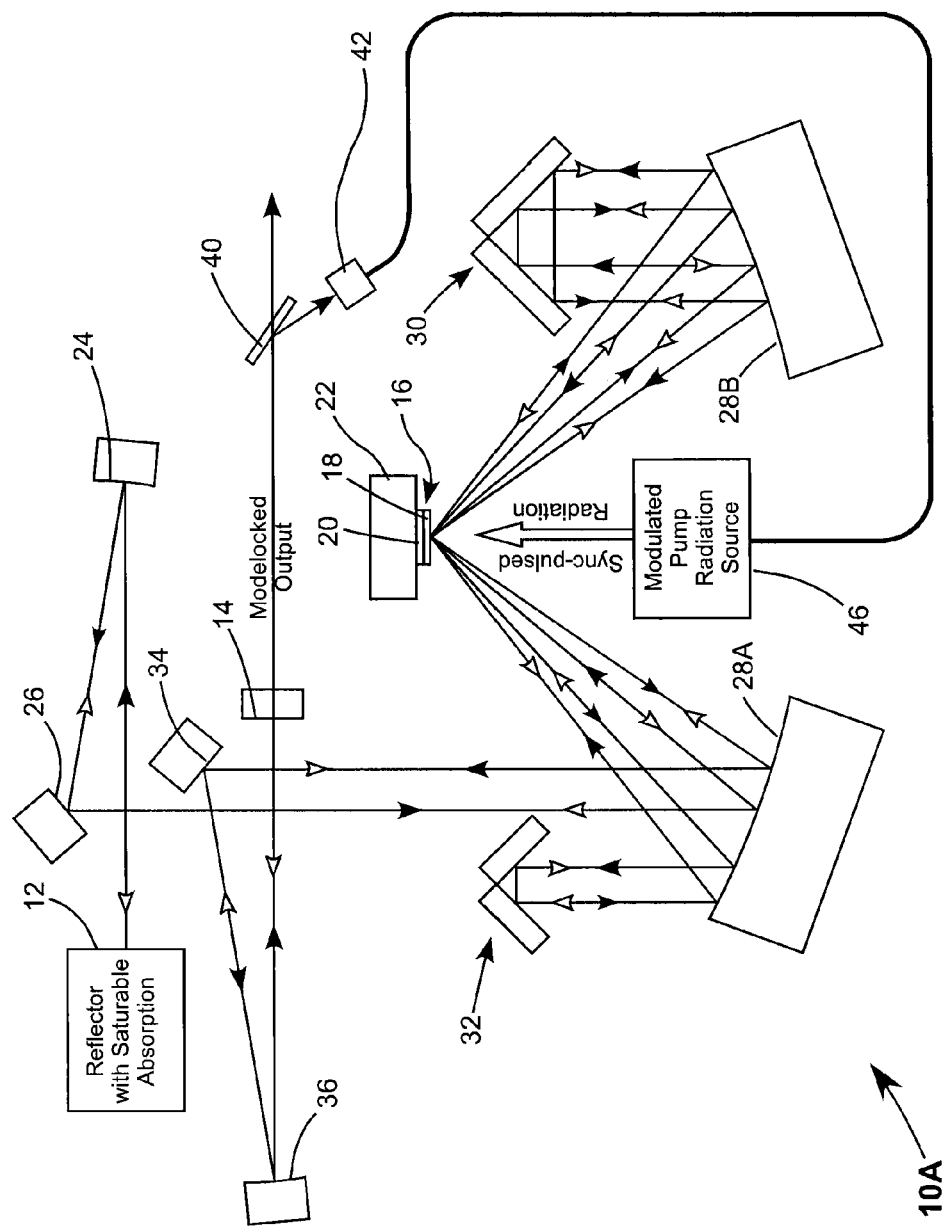
FIG. 2 schematically illustrates another preferred embodiment of a mode-locked OPS-laser in accordance with the present invention, similar to the laser of FIG. 1 but further including an arrangement for synchronous, pulsed optical pumping of the OPS gain-structure.

FIG. 2 schematically illustrates another preferred embodiment of a mode-locked OPS-laser in accordance with the present invention, similar to the laser of FIG. 1 but further including an arrangement for synchronous pulsed optical pumping of the OPS gain structure. A pick-off mirror 40 directs a portion of the pulsed output from output coupling mirror 14 to a photo-diode 42 which is in electrical communication with a modulatable pump-radiation source 46. Output of the photo-diode provides a measure of the instant output PRF of laser 10. This allows the synchronous pulsed pumping PRF to be adjusted to take into account frequency drift of the output due to slight changes in the resonator length. Additional information regarding synchronous pumping of an OPS-laser can be found in commonly owned U.S. Publication 2009/0290606, the disclosure of which is incorporated herein by reference.

Synchronous pumping reduces the thermal load on the OPS-structure by cutting off delivery of pump radiation to the OPS-structure when pulses are not being generated and delivered. However, synchronous pumping becomes difficult at frequencies on the order of 100 MHz, because of difficulty in pulsed modulation of a high drive-current for diode-lasers, and difficulty of the diode-lasers in producing an optical output that follows the temporal shape of the current pulses. A possible alternative is to drive the pump-radiation source with an analog modulated current, such as a sinusoidally modulated current.

Figure 3:
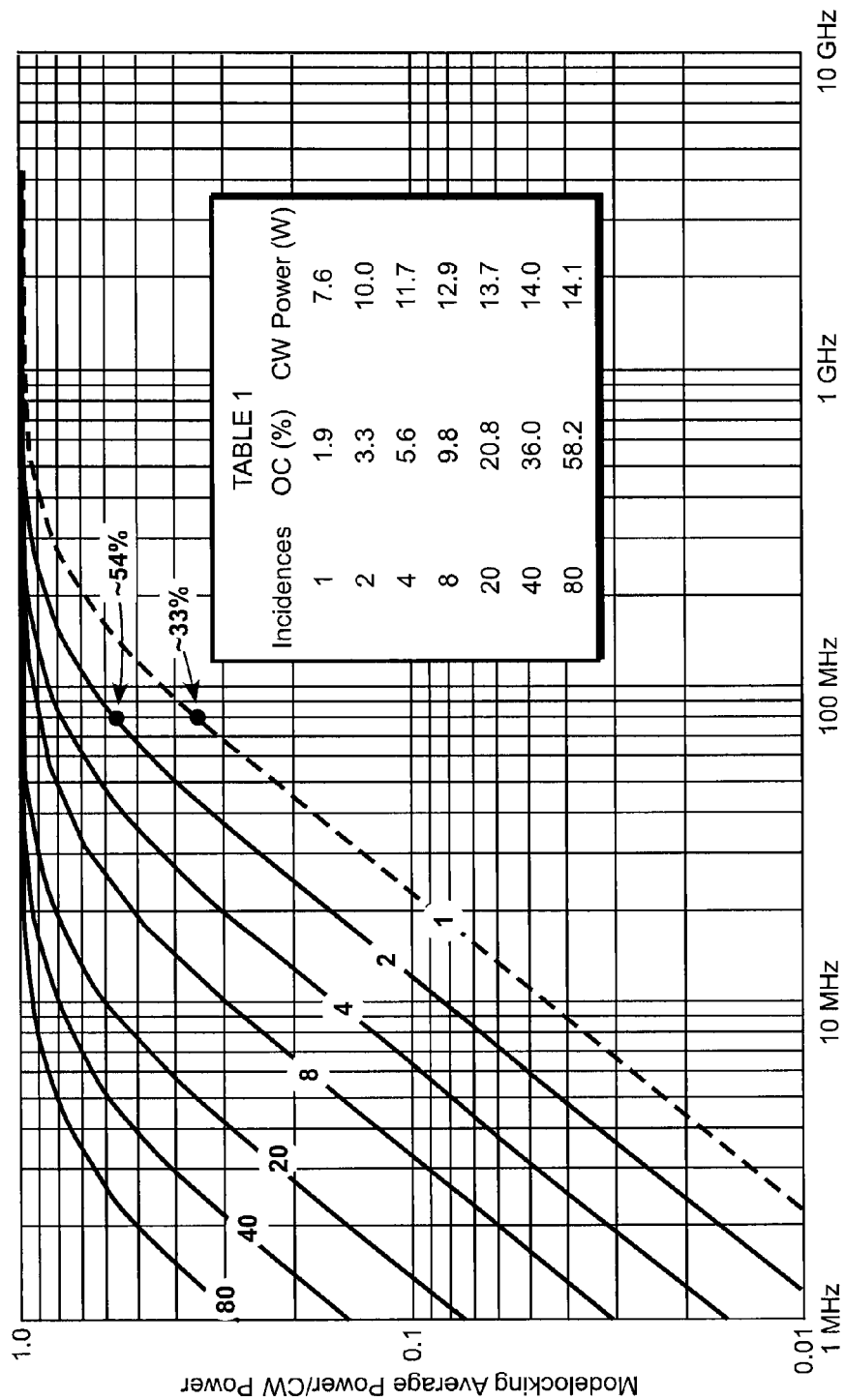
FIG. 3 is a graph schematically illustrating a calculated ratio of average mode-locked output power to basic CW power as a function of mode-locking frequency for various numbers of incidences on the OPS-structure in an example of a mode-locked OPS-laser in accordance with the present invention.

FIG. 3 is a graph schematically illustrating a calculated ratio of average mode-locked output power to basic CW power (mode-lock ratio) as a function of mode-locking frequency for various numbers of incidences on the OPS-structure in an example of a mode-locked OPS-laser in accordance with the present invention. It is assumed in the calculation that there is a fixed loss in the resonator of 1%, plus an added loss of 0.2% times the number of incidences on the OPS-chip, to account for the fact that the losses in the steering mirrors increase linearly with the number of such incidences. It is further assumed that the excited-state lifetime of the OPS gain-structure is 3.0 ns; the unsaturated gain per incidence is 8%; the saturation intensity is 100 kW/cm$^2$; the beam size is 400 um (1/e$^2$ radius); the corresponding saturation power is 251 W; and the corresponding saturation fluence for the pulses is 754 nanojoules (nJ).

The output coupling percentage, which in resonator 11 is the transmission percentage of minor 14, was optimized for each number of incidences calculated. The number of incidences is indicated on each corresponding curve. The dotted curve indicates the calculated performance that would be obtained for a prior-art OPS-laser-resonator, terminated by the mirror-structure of the OPS-chip, such that there is only one incidence on the OPS-chip per round trip in the resonator. TABLE 1, inset in the graph of FIG. 3, provides the calculated optimum output coupling percentage and the actual calculated CW power for each number of incidences. Note here, that at the typical 80 MHz PRF of a prior-art mode-locked laser, the mode-locked average power with only one incidence per round trip is less than 35% of the available CW power. With two incidences on the OPS-chip per round trip, as could be achieved in a prior-art OPS-laser-resonator folded by the mirror-structure of an OPS-structure, the mode-locked OPS-power rises only to about 54% of the available CW power.

It is pointed out here that a solid-state gain-medium used in so-called "thin-disk" lasers has an excited-state lifetime very much greater than that of an OPS gain-structure. By way of example, ytterbium-doped yttrium aluminum garnet (Yb:YAG) has an excited-state lifetime close to a millisecond. Because of this, there would be no indication of any dependence of the mode-lock ratio on the number of incidences on such a gain-medium, in the normal PRF range of mode-locked solid-state lasers.

Figure 3A:
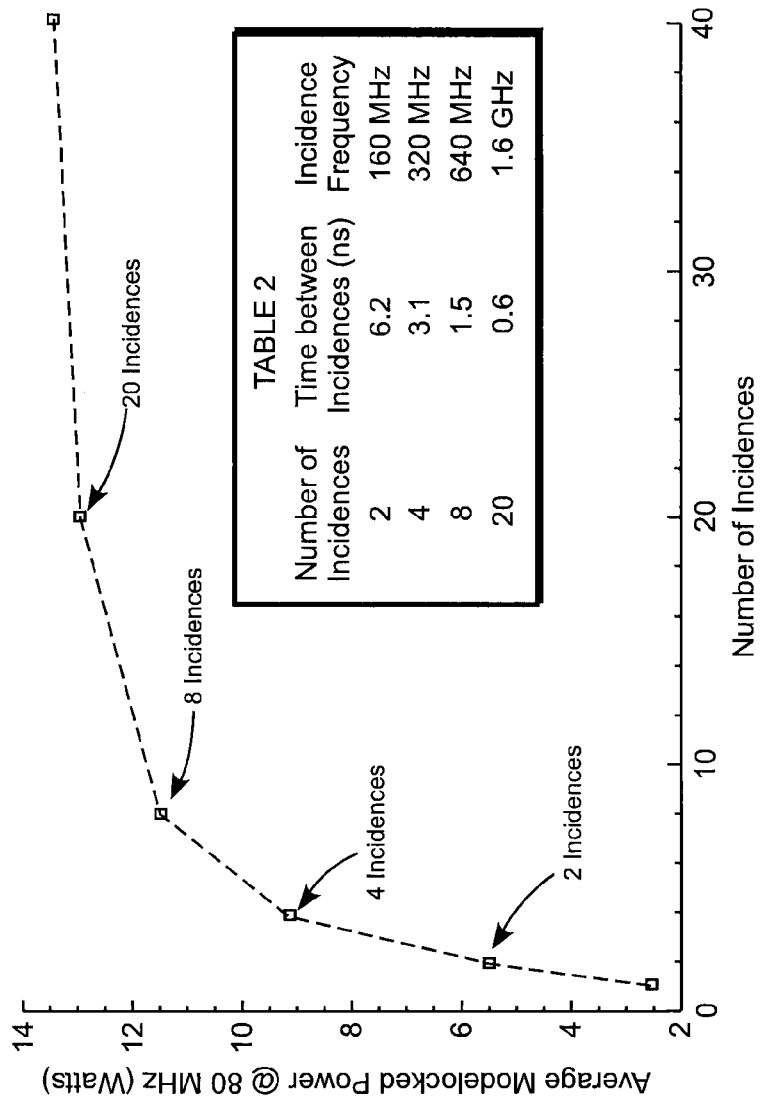
FIG. 3A is a graph schematically illustrating calculated mode-locked output power as a function of number of incidences on the OPS-structure at a mode-locking frequency of 80 MHz in the example of FIG. 3.

FIG. 3A is a graph schematically illustrating calculated mode-locked output power as a function of number of incidences on the OPS structure at a mode-locking frequency of 80 MHz in the example of FIG. 3. The dashed line joining calculated points on the graph is merely for trend indication. It is evident from the graph of FIG. 3A that a dramatic increase in mode-locked output requires a minimum of about 4 incidences on the OPS-chip per round-trip in the resonator. Given a round-trip time of about 12.5 ns for radiation circulating in the resonator, this implies that the time between incidences of the radiation is preferably no greater than about 3 ns, i.e., no greater than about an excited-state lifetime of the semiconductor gain-structure. TABLE 2 inset in FIG. 3A indicates approximate time between incidences, and incidence frequency, for 2, 4, 8, and 20 incidences in the inventive 80 MHz mode-locked resonator. The arrangement of the present invention becomes practically useful only when there are four or more OPS-chip incidences per round trip providing a period between incidences less than about twice the excited state lifetime of the OPS gain-structure.

The mode-locked power increase between 8 incidences and 20 incidences is relatively modest, but the additional incidences may be warranted if there is a need to take advantage of the higher output-coupling to accommodate one or more lossy elements in the resonator, for example, elements of a dispersion-compensating device. On a practical note, however, no matter how many incidences occur, the OPS-chip must be packaged as flat as possible. Any departure from flatness, particularly curvature, will be compounded by the number of incidences, and will compromise an ability to image the circulating beam (align the oscillating mode) repeatedly in the same spot on the OPS-chip, which, of course, is required to maximize interaction with the pump-radiation. Preferably, even for as few as 4 incidences, the OPS-chip should not have a radius of curvature less than about 10.0 meters, positive or negative, otherwise mode-misalignment and, accordingly, mode-locked power-output may be compromised.

Figure 4:
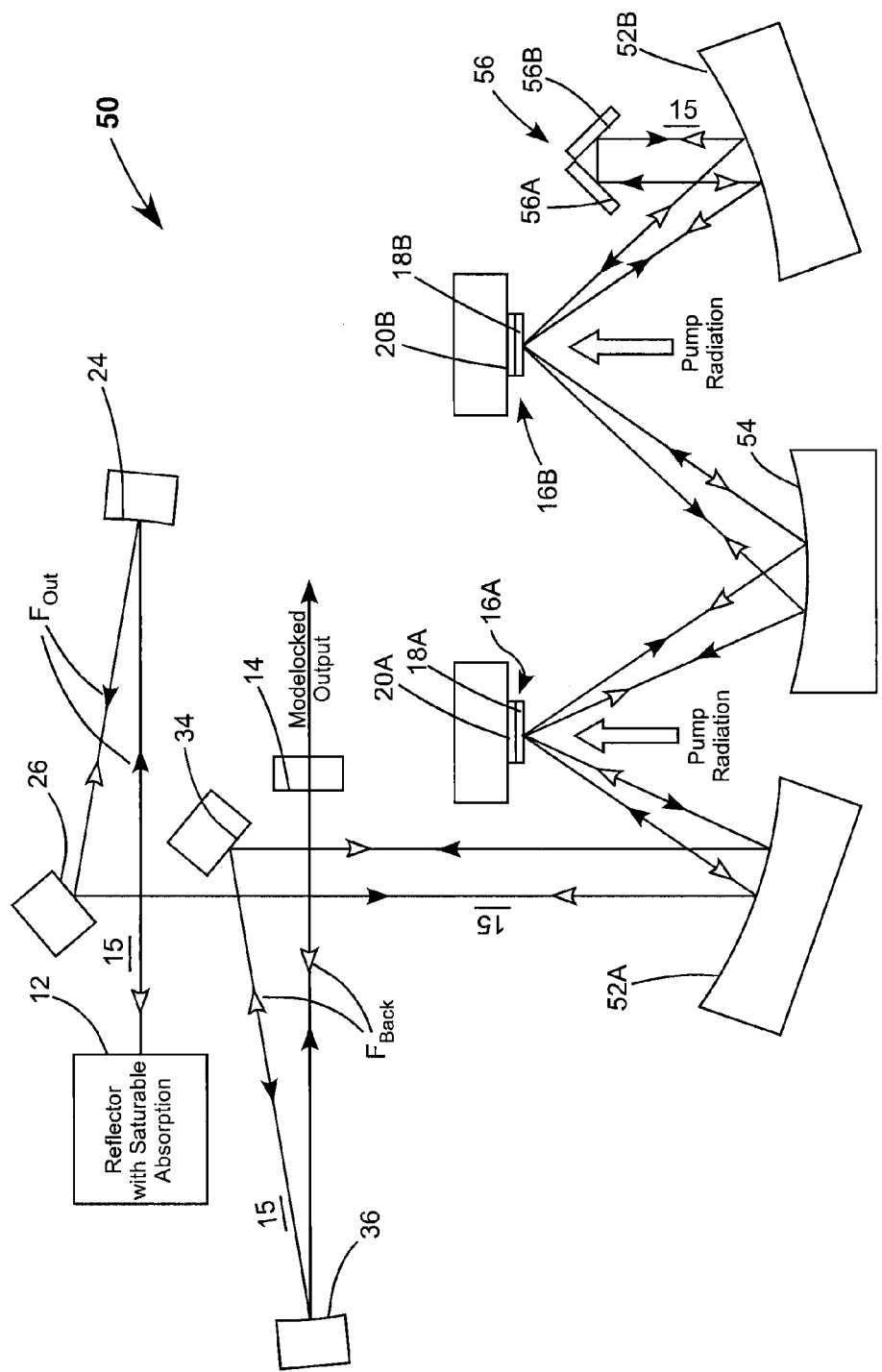
FIG. 4 schematically illustrates yet another preferred embodiment of a mode-locked OPS-laser in accordance with the present invention, similar to the laser of FIG. 1, but wherein there are two OPS-structures in the resonator and the radiation circulating in the resonator makes four incidences on each gain-structure during each round trip in the resonator.

FIG. 4 schematically illustrates yet another preferred embodiment 50 of a mode-locked OPS-laser in accordance with the present invention, similar in function to the laser of FIG. 1 but wherein the single OPS-chip 16 is replaced in apparatus 50 by two OPS-chips 16A and 16B, which can have the same or a different peak gain wavelength. Further, because of the additional OPS-chip, mode-imaging mirrors 28A and 28B of the apparatus FIG. 1 are replaced in apparatus 50 by three mirrors 52A, 52B, and 54. There is only one corner (retro) reflector, i.e., retro-reflector 56 with mirrors 56A and 56B.

A round trip in resonator 15 of apparatus 50 is depicted by solid arrowheads (first pass through the multiple incidence arrangement) and open arrowheads (second pass through the multiple incidence arrangement) as used to depict a round trip in the apparatus of FIG. 1. It can be seen that in apparatus 50, there are four incidences of the circulating radiation on each OPS-chip. This provides for eight "gain-incidences" or "OPS-chip incidences" per round trip, as in resonator 11 of the apparatus of FIG. 1. Those skilled in the art will recognize, without further illustration or detailed description, that apparatus arranged similarly to OPS 50 could be extended, in theory at least, to include three OPS-chips providing twelve gain-incidences per round trip, four OPS-chips providing sixteen gain-incidences per round trip, and so forth.

Continuing with reference to FIG. 4, if the gain-bandwidth of OPS-chips 16A and 16B are matched, performance of apparatus 50 can be predicted from the graphs of FIG. 3 and FIG. 3A. Indeed, the loss per gain-incidence assumed in the calculation of those graphs can be less in apparatus 50 than in apparatus 10, because there are fewer reflectors involved in providing each incidence.

It is possible that the gain bandwidths of OPS-chips 16A can be deliberately mismatched to extend the aggregate gain-bandwidth of the plurality of OPS-chips in the resonator. This could be done, for example, to provide a limited range of tunability (using a tunable wavelength-selective element in the resonator) or to reduce the duration of the mode-locked pulses. By way of example, for a nominal lasing wavelength of about 900 nm, it is believed that, practically, a net gain-bandwidth (FWHM) of about 45 nm can be achieved with OPS-chips having the typical gain-bandwidth of about 30 nm, with a peak aggregate gain about 40% greater than the peak gain by a single OPS-chip.

Regarding pulse duration, it is believed that a pulse-duration of about 200 femtoseconds (fs) or less can be obtained in apparatus in accordance with the present invention. Any of the fold-mirrors in the resonators described above can be coated with mirrors that provide negative dispersion (NGDD minors) for compensating any pulse-duration-extending positive dispersion that might occur in the OPS-structures. It is also possible to design some dispersion compensation into the OPS-chips or SESAM 12 by suitable arrangement of layer thicknesses thereof. Principles of NGDD mirror design are described in detail in U.S. Pat. Nos. 6,081,379 and 6,154,318, each thereof assigned to the assignee of the present invention, and the complete disclosure of which is hereby incorporated herein by reference. Software that will enable NGGD mirror coatings to be automatically designed according to the principles described is commercially available from more than one supplier of optical thin film design software. Further, NGDD minor coatings are commercially available from more than one supplier of optical coatings.

It should be noted here that in the inventive laser-resonators described, above the angle of incidence of radiation on the OPS-chip or chips is exaggerated for convenience of describing and depicting the multiple-incidence beam-paths to the OPS-chips. In practice, it is preferable to minimize these angles of incidence for optimizing the aggregate gain from the multiple incidences, among other reasons. In resonator 10 of FIG. 1, imaging-mirrors 28A and 28B could be replaced by a single parabolic mirror having a central aperture through which pump-radiation could be delivered. While optical pumping (energizing) of the semiconductor gain-structures is preferred, the gain-structures could be electrically energized, as described, for example, in U.S. Pat. No. 6,243,407, the complete disclosure of which is hereby incorporated by reference. Those skilled in the art may make these and other modifications of the inventive resonators without departing from the sprit and scope of the present invention.

It should also be noted that in either the "single-chip" embodiments of FIGS. 1 and 2 or the multichip embodiment of FIG. 4, it is preferred that the resonator is configured such that the time between successive gain-incidences in a round trip is about the same. This is facilitated by the one-to-one imaging arrangement for the successive incidences, inasmuch as there is a substantial freedom of choice of focal length of the imaging mirrors that can achieve the one-to-one imaging.

In conclusion, the present invention overcomes above discussed shortcomings of prior-art, mode-locked OPS-lasers by providing a resonator having a length selected to provide a mode-locked PRF of 150 MHz or less while providing a significantly higher round-trip frequency of OPS-chip incidences of radiation circulating in the resonator. The frequency of the round-trip OPS-chip incidences is selected such that the period between these incidences is sufficiently short to promote effective build up of pulse-energy in the round trip.

The invention is described above with reference to a preferred and other embodiments. The invention, however, is not limited to the embodiments described and depicted, herein. Rather, the invention is defined by the claims appended hereto.

What is claimed is:

1. Laser apparatus, comprising:
a laser-resonator having a resonator length;
at least one surface-emitting multilayer semiconductor gain-structure located in the laser-resonator, the at least one and any other gain-structure including a plurality of active-layers spaced apart by spacer-layers and having an excited-state lifetime characteristic of material of the active-layers;
means for energizing the gain-structure, thereby causing radiation having a fundamental wavelength characteristic of the active layers of the gain-structure to circulate in the laser-resonator;
mode-locking means located in the laser-resonator for causing the circulating radiation to circulate as sequence of mode-locked pulses at a predetermined pulse-repetition frequency determined by the resonator length wherein the pulses have a duration of about 200 femtoseconds or less; and
an optical arrangement for causing the circulating radiation to make at least 4 gain-structure incidences during each round trip thereof in the laser-resonator, with a predetermined time between gain-structure incidences less than twice excited-state lifetime of the gain-structure.

2. The apparatus of claim 1, wherein the resonator length is selected such that the pulse repetition frequency is between about 50 megahertz and 150 megahertz and wherein the excited state lifetime of the at least one and any other gain-structure is less than about 10 nanoseconds.

3. The apparatus of claim 1, wherein there is only one surface-emitting multilayer semiconductor gain-structure located in the laser-resonator.

4. The apparatus of claim 1, wherein there is a plurality of surface-emitting multilayer semiconductor gain-structures located in the laser-resonator.

5. The apparatus of claim 1, wherein the means for energizing the gain structure is a source of optical pump radiation.

6. The apparatus of claim 5, wherein the pump-radiation is repeatedly pulsed radiation at the same pulse-repetition frequency as that of the mode-locked laser radiation circulating in the laser-resonator.

7. The apparatus of claim 1, wherein the mode-locking means is a saturable absorption minor.

8. The apparatus of claim 7, wherein the laser resonator is a standing-wave laser resonator and is terminated by first and second mirrors and the saturable absorbing minor is the first minor.

9. The apparatus of claim 8, wherein the second minor is an output coupling minor of the laser resonator.

10. The apparatus of claim 1, wherein the time between gain-structure incidences is equal to or less than about the excited-state lifetime of the gain-structure.

11. A mode-locked, external-cavity, optically pumped semiconductor laser, comprising:
a laser-resonator having a resonator length;
a surface-emitting multilayer semiconductor gain-structure located in the laser-resonator the gain-structure including a plurality of active-layers spaced apart by spacer-layers and having an excited-state lifetime characteristic of material of the active-layers;
a light source for optically pumping the gain-structure, thereby causing radiation having a fundamental wavelength characteristic of the active layers of the gain-structure to circulate in the laser-resonator;
mode-locking means located in the laser-resonator for causing the circulating radiation to circulate as sequence of mode-locked pulses at a predetermined pulse-repetition frequency the resonator length being selected such that the pulse-repetition frequency is between about 50 megahertz and about 150 megahertz and wherein the pulses have a duration of about 200 femtoseconds or less; and
one or more mirrors arranged to cause the circulating radiation to make at least 4 incidences on the gain-structure during each round trip thereof in the laser-resonator.

12. The laser of claim 11, wherein the mode-locking means is a saturable absorption mirror.

13. The laser of claim 12, wherein the laser resonator is a standing-wave laser resonator and is terminated by first and second minors, the saturable absorption minor being the first minor.

14. The laser of claim 13, wherein the second mirror is an output coupling minor of the laser resonator.

15. The laser of claim 11, wherein the optical arrangement for causing the circulating radiation to make at least 4 incidences on the gain-structure is configured such that the time between successive incidences is about the same.

16. The laser of claim 15, wherein the time between the successive incidences is less than about 10 nanoseconds.

* * * * *